United States Patent
Hu et al.

(10) Patent No.: US 10,404,243 B2
(45) Date of Patent: Sep. 3, 2019

(54) CLOCK DELAY ADJUSTING CIRCUIT BASED ON EDGE ADDITION AND INTEGRATED CHIP THEREOF

(71) Applicant: NO. 24 RESEARCH INSTITUTE OF CHINA ELECTRONIC TECHNOLOGY CORPORATION, Chongqing (CN)

(72) Inventors: Rongbin Hu, Chongqing (CN); Can Zhu, Chongqing (CN); Yonglu Wang, Chongqing (CN); Zhengping Zhang, Chongqing (CN); Lei Zhang, Chongqing (CN); Yuhan Gao, Chongqing (CN); Rongke Ye, Chongqing (CN); Guangbing Chen, Chongqing (CN); Yuxin Wang, Chongqing (CN); Dongbing Fu, Chongqing (CN)

(73) Assignee: NO. 24 RESEARCH INSTITUTE OF CHINA ELECTRONIC TECHNOLOGY CORPORATION, Chongqing (CN)

( * ) Notice: Subject to any disclaimer, the term of this patent is extended or adjusted under 35 U.S.C. 154(b) by 167 days.

(21) Appl. No.: 15/313,809

(22) PCT Filed: Oct. 20, 2014

(86) PCT No.: PCT/CN2014/088913
§ 371 (c)(1),
(2) Date: Nov. 23, 2016

(87) PCT Pub. No.: WO2016/041229
PCT Pub. Date: Mar. 24, 2016

(65) Prior Publication Data
US 2017/0214397 A1  Jul. 27, 2017

(30) Foreign Application Priority Data
Sep. 19, 2014  (CN) .......................... 2014 1 0482378

(51) Int. Cl.
*H03K 5/135* (2006.01)
*H03K 5/00* (2006.01)

(52) U.S. Cl.
CPC ... *H03K 5/135* (2013.01); *H03K 2005/00078* (2013.01); *H03K 2005/00163* (2013.01)

(58) Field of Classification Search
CPC ........ H03K 5/131; H03K 5/133; H03K 5/135; H03K 5/14; H03K 5/156;
(Continued)

(56) References Cited

U.S. PATENT DOCUMENTS 6,469,493 B1  10/2002 Muething, Jr. et al.
7,088,163 B1 *  8/2006 Bell ....................... H03K 5/135
                                            327/271

(Continued)

FOREIGN PATENT DOCUMENTS

CN  1192275 A  9/1998
CN  1573346 A  2/2005
(Continued)

OTHER PUBLICATIONS

Feb. 26, 2015 International Search Report issued in International Patent Application No. PCT/CN2014/088913.

*Primary Examiner* — Patrick O Neill
(74) *Attorney, Agent, or Firm* — Oliff PLC

(57) ABSTRACT

The invention provides a clock delay adjusting circuit based on edge addition and an integrated chip thereof. The clock delay adjusting circuit comprises a clock delay unit, a weight coefficient unit and an edge addition unit, wherein the clock delay unit is used for conducting equal-interval delay on clock signals inputted into the input end of the clock delay
(Continued)

unit to obtain and output at least three delay clock signals at equal intervals, the weight coefficient unit is used for generating weight signals with the number the same as the number of the delay clock signals according to digital codes inputted into the input end of the weight coefficient unit and outputting the weight signals, and the edge addition unit is used for receiving the delay clock signals and the weight signals, conducting weighted summation on the delay clock signals according to the weight signals and outputting signals obtained through weighted summation to obtain new clock signals with continuous clock rising edges/continuous clock falling edges, wherein the number of the new clock signals is the same as the number of the delay clock signals. In addition, the clock delay adjusting circuit can be made into the integrated chip. In view of the present invention, the problems that an existing clock delay adjusting circuit is low in adjustment accuracy and can not meet the requirement for high-precision time-share sampling are well solved.

18 Claims, 6 Drawing Sheets

(58) Field of Classification Search
CPC .......... H03K 2005/00058; H03K 2005/00065; H03K 2005/00163; H03K 2005/00176; H03K 2005/00182; H03K 2005/00228
See application file for complete search history.

(56) References Cited

U.S. PATENT DOCUMENTS

| | | | |
|---|---|---|---|
| 7,315,593 B2 | 1/2008 | Hagen et al. | |
| 8,422,340 B2 | 4/2013 | Hutchinson | |
| 8,787,776 B2 | 7/2014 | Carusone et al. | |
| 9,025,971 B2* | 5/2015 | Ide ................ | H04B 10/6933 |
| | | | 398/208 |
| 9,350,343 B2* | 5/2016 | Kase ................ | H03K 17/693 |
| 2004/0223569 A1 | 11/2004 | Hagen et al. | |
| 2009/0179674 A1* | 7/2009 | Tamura ................ | H03K 5/13 |
| | | | 327/155 |
| 2010/0141240 A1 | 6/2010 | Hutchinson | |
| 2012/0141122 A1 | 6/2012 | Carusone et al. | |
| 2014/0223221 A1 | 8/2014 | Verbeure | |

FOREIGN PATENT DOCUMENTS

| | | |
|---|---|---|
| CN | 102246415 A | 11/2011 |
| CN | 102420649 A | 4/2012 |
| CN | 103970180 A | 8/2014 |

* cited by examiner

CLOCK DELAY ADJUSTING CIRCUIT BASED ON EDGE ADDITION AND INTEGRATED CHIP THEREOF

BACKGROUND OF THE PRESENT INVENTION

Field of Invention

The present invention relates to the field of integrated circuits, and particularly relates to a clock delay adjusting circuit.

Description of Related Arts

It requires for accurately controlling occurring time of sampling during time-share sampling ADC. Wherein, a sampling circuit is controlled by a sampling clock, i.e., it may control the occurring time of sampling by adjusting the occurring time of the sampling clock, while the occurring time of the sampling clock may be achieved by adjusting a transmission path delay of the sampling clock.

In the existing control technology of the occurring time of sampling, it mainly adopts a clock delay adjusting circuit based on a delay unit selection method to achieve the control of the occurring time of sampling. For example, as shown in FIG. 1, it is a clock delay adjusting circuit based on a delay unit selection, comprising a plurality of sequentially connected delay units and a selection circuit, wherein output ends of the plurality of delay units are connected with the selection circuit respectively. The principle of the clock delay adjustment is that: input clock signal $K_{in}$, sequentially passes though the plurality of delay units to obtain a plurality of different clock signals K1, K2, K3, K4, which are increased by a delay unit delay in turn with regard to the original input clock signal Kin, and are further sent to the selection circuit, to select one of the delay clock signals according to different values of digital codes of S0 and S1, and output $K_{out}$.

In view of the foregoing, the adjustment accuracy of the existing clock delay adjusting circuit based on the delay unit selection is a delay time of one delay unit. As for the current semiconductor technology, the delay time of the delay unit is merely of the order of $10^{-12}$ second, which is far from enough to satisfy the requirement of a high speed, high-precision time-share sampling ADC for accurate clock delay adjustments.

Therefore, it has been an urgent problem in the technical field that how to further improve the precision of the clock transmission path delay to satisfy the requirement of the time-share sampling ADC.

SUMMARY OF THE PRESENT INVENTION

In view of the above disadvantages in the prior art, an object of the present invention is to provide a clock delay adjusting circuit based on edge addition, to solve problems that an existing clock delay adjusting circuit is not high in adjustment accuracy and can not meet the technical requirement for high speed and high-precision time-share sampling ADC.

In order to achieve the above object and other related objects, the present invention provides the following technical solutions:

a lock delay adjusting circuit based on edge addition, comprising: a clock delay unit, which is used for conducting equal-interval delay on clock signals inputted into the input end of the clock delay unit to obtain and output at least three delay clock signals at equal intervals; a weight coefficient unit, which is used for generating weight signals with the number the same as the number of the delay clock signals according to digital codes inputted into the input end of the weight coefficient unit and outputting the weight signals; an edge addition unit, which is used for receiving the delay clock signals and the weight signals, conducting weighted summation on the delay clock signals according to the weight signals and outputting signals obtained through weighted summation to obtain new clock signals with continuous clock rising edges/continuous clock falling edges, wherein the number of the new clock signals is the same as the number of the delay clock signals.

Preferably, in the above lock delay adjusting circuit based on edge addition, one of the weight signals is an average value of all other weight signals.

Preferably, in the above lock delay adjusting circuit based on edge addition, the three delay clock signals comprise a first delay clock signal, a second delay clock signal and a third delay clock signal.

As a further improvement of the above technical solutions, the three weight signals are a first weight signal, a third weight signal and a second weight signal in sequence, the second weight signal is an average value of the first weight signal and the third weight signal.

Preferably, in the above lock delay adjusting circuit based on edge addition, wherein, the clock delay unit comprises four delay circuits with the same structure, which are a first delay circuit, a second delay circuit, a third delay circuit and a fourth delay circuit respectively; wherein an input end of the first delay circuit is used for receiving the clock signals, an output end of the first delay circuit outputs the first delay clock signal and is connected with an input end of the second delay circuit, an output end of the second delay circuit outputs the second delay clock signal and is connected with an input end of the third delay circuit, an output end of the third delay circuit outputs the third delay clock signal and is connected with an input end of the fourth delay circuit, an output end of the fourth delay circuit is idle.

As a further improvement of the above technical solutions, the weight coefficient unit comprises: a digital-to-analog converter, which is used for converting the digital codes inputted by the input end of the weight coefficient unit into a pair of differential analog signals and outputting the pair of differential analog signals; an amplifier, which is used for receiving the differential analog signals and outputting amplified differential analog signals; a drive circuit, which is used for receiving the amplified differential analog signals by the amplifier, dividing the amplified differential analog signals into three weight signals and outputting the weight signals.

As a further improvement of the above technical solutions, the drive circuit comprises a first emitter follower, a second emitter follower, a first resistor and a second resistor, wherein, the first resistor and the second resistor have a same resistance value; and, the first emitter follower consists of a third resistor, a first bipolar junction transistor, a first DC current source and a source voltage, wherein a base of the first bipolar junction transistor is an input end of the drive circuit, an emitter of the first bipolar junction transistor is connected with an end of the first DC current source, the other end of the first DC current source is connected with a negative electrode of the source voltage, a collector of the first bipolar junction transistor is connected with an end of the third resistor, the other end of the third resistor is connected with a positive electrode of the source voltage;

the second emitter follower consists of a fourth resistor, a second bipolar junction transistor, a second DC current source and a source voltage, wherein a base of the second bipolar junction transistor is an input end of the drive circuit, an emitter of the second bipolar junction transistor is connected with an end of the second DC current source, the other end of the second DC current source is connected with the negative electrode of the source voltage, a collector of the second bipolar junction transistor is connected with an end of the fourth resistor, the other end of the fourth resistor is connected with a positive electrode of the source voltage; an end of the first resistor is connected with the emitter of the first bipolar junction transistor, the other end of the first resistor is connected with an end of the second resistor, the other end of the second resistor is connected with the emitter of the second bipolar junction transistor, the bases of the first bipolar junction transistor and the second bipolar junction transistor are used for receiving the differential analog signals amplified by the amplifier, the weight signals are outputted by the emitters of the first bipolar junction transistor and the second bipolar junction transistor, as well as a node between the first resistor and the second resistor are used for outputting the weight signals.

As a further improvement of the above technical solutions, the edge addition unit consists of a fifth resistor, a sixth resistor, a third DC current source, a source voltage and differential pair circuits, wherein the number of the differential pair circuits is the same as the number of the delay clock signals, the differential pair circuits comprise a first differential pair circuit, a second differential pair circuit and a third differential pair circuit; the first differential pair circuit consists of a third bipolar junction transistor, a fourth bipolar junction transistor and a ninth bipolar junction transistor, bases of the third bipolar junction transistor and the fourth bipolar junction transistor serve as a first input end of the first differential pair circuit, collectors of the third bipolar junction transistor and the fourth bipolar junction transistor serve as an output end of the first differential pair circuit, emitters of the third bipolar junction transistor and the fourth bipolar junction transistor are together connected with a collector of the ninth bipolar junction transistor, a base of the ninth bipolar junction transistor serves as a second input end of the first differential pair circuit; the second differential pair circuit consists of a fifth bipolar junction transistor, a sixth bipolar junction transistor and a tenth bipolar junction transistor, bases of the fifth bipolar junction transistor and the sixth bipolar junction transistor serve as a first input end of the second differential pair circuit, collectors of the fifth bipolar junction transistor and the sixth bipolar junction transistor serve as an output end of the second differential pair circuit, emitters of the fifth bipolar junction transistor and the sixth bipolar junction transistor are together connected with a collector of the tenth bipolar junction transistor, a base of the tenth bipolar junction transistor serves as a second input end of the second differential pair circuit; the third differential pair circuit consists of a seventh bipolar junction transistor, an eighth bipolar junction transistor and the an eleventh bipolar junction transistor bases of the seventh bipolar junction transistor and the eighth bipolar junction transistor serve as a first input end of the third differential pair circuit, collectors of the seventh bipolar junction transistor and the eighth bipolar junction transistor serve as an output end of the third differential pair circuit, emitters of the seventh bipolar junction transistor and the eighth bipolar junction transistor are together connected with a collector of the eleventh bipolar junction transistor, a base of the eleventh bipolar junction transistor serves as a second input end of the third differential pair circuit; emitters of the ninth bipolar junction transistor, the tenth bipolar junction transistor and the eleventh bipolar junction transistor are together connected with an end of the third DC current source, the other end of the third DC current source is connected with the negative electrode of the source voltage; an end of the fifth resistor is connected with the collectors of the third bipolar junction transistor, the fifth bipolar junction transistor and the seventh bipolar junction transistor, the other end of the fifth resistor is connected with the a positive electrode of the source voltage; and an end of the sixth resistor is connected with the collectors of the fourth bipolar junction transistor, the sixth bipolar junction transistor and the eighth bipolar junction transistor, the other end of the sixth resistor is connected with the a positive electrode of the source voltage.

Preferably, in the above lock delay adjusting circuit based on edge addition, the clock unit is a differential signal.

From the above, the present invention has the following beneficial effects: by conducting equal-interval delays on clock signals to obtain a plurality of delay clock signals, generating weight signals with the number same as the number of the delay clock signals by digital codes, and conducting weighted summation on the plurality of delay clock signals according to the weight signals, new clock signals with multiple continuous clock rising edges/continuous clock falling edges and having the same amplitude as the clock signals are obtained; then it only requires to change the digital codes to overall raise or fall the rising edges/falling edges of the new clock signals, so as to achieve the advance or delay of the occurring time of shifting level, and to achieve the increase or decrease of the clock transmission path delay. As compared to the existing method based on the delay unit selection, the present invention has adjustment accuracy of the order of $10^{-15}$ (fs), which is much higher than the existing clock delay adjustment. The present invention well solves the problems that the conventional clock delay adjusting method and circuit is low in adjustment accuracy and can not satisfy the requirement of a high speed, high-precision time-share sampling ADC for accurate clock delay adjustments.

Figure 1:
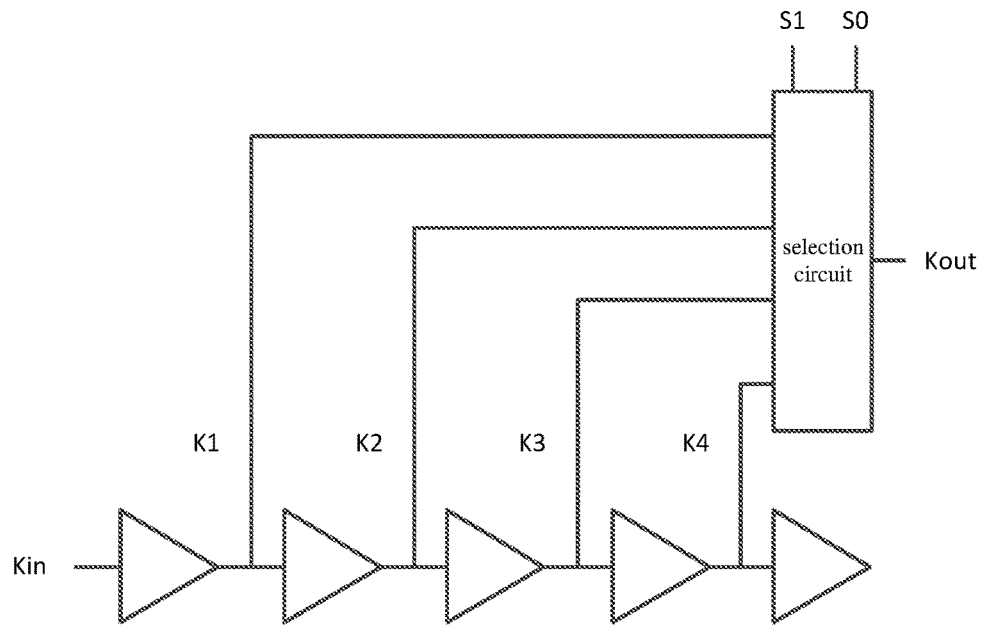
FIG. 1 shows a schematic diagram of a clock delay adjusting circuit based on a delay unit selection of the prior art.

DESCRIPTION OF COMPONENT REFERENCE SIGNS 1 clock delay unit
11a first delay circuit
11b second delay circuit
11c third delay circuit
11d fourth delay circuit
2 weight coefficient unit
21 digital-to-analog converter
22 amplifier
23 drive circuit
231 first emitter follower
233 second emitter follower
3 edge addition unit
31a first differential pair circuit
31b second differential pair circuit
31c third differential pair circuit

DETAILED DESCRIPTION OF THE PREFERRED EMBODIMENTS

The embodiments of the present invention will be described below through specific examples. One skilled in the art can easily understand other advantages and effects of the present invention according to the contents disclosed by the description. The present invention can also be implemented or applied through other different specific embodiments. Various modifications or variations can be made to all details in the description based on different points of view and applications without departing from the spirit of the present invention. It needs to be noted that the following embodiments and the features in the embodiments may be combined together in a condition without inconsistency.

It needs to be noted that the drawings provided in this embodiment are just used for exemplarily describing the basic concept of the present invention, thus the drawings only show components related to the present invention but are not drawn according to component numbers, shapes and sizes during actual implementation, the patterns, numbers and proportions of all components can be randomly changed during actual implementation, and the component layout patterns can also be more complex.

Figure 2:
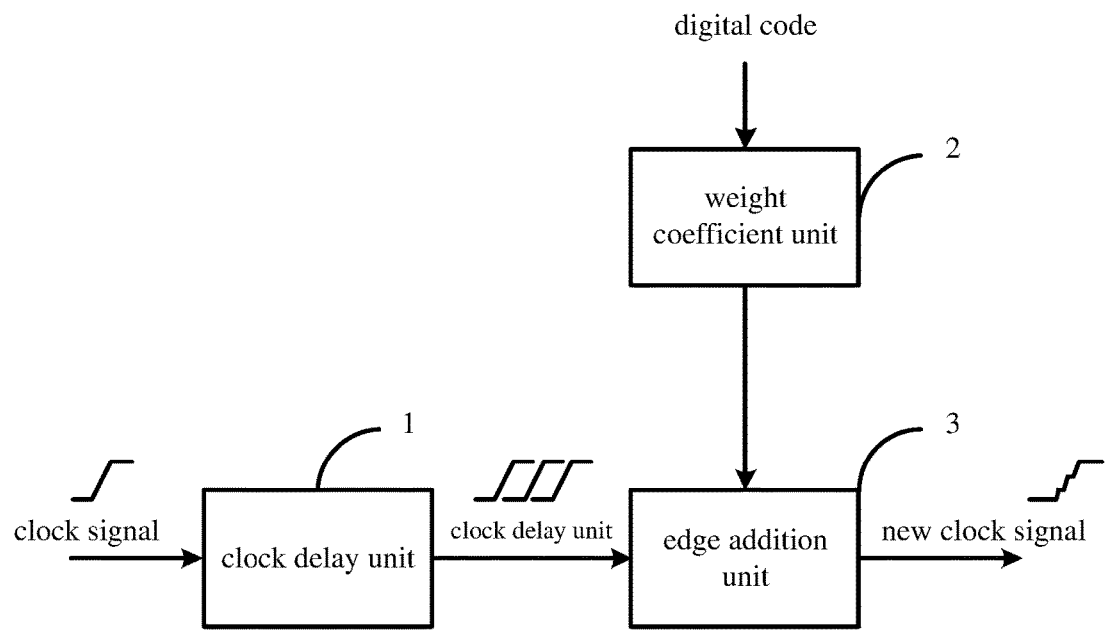
FIG. 2 shows a schematic diagram of a clock delay adjusting circuit based on edge addition of the present invention.

Please refer to FIG. 2, it is shown to a schematic diagram of a clock delay adjusting circuit based on edge addition of the present invention. In the invention, the clock delay adjusting circuit based on edge addition comprises a clock delay unit 1, a weight coefficient unit 2 and an edge addition unit 3, wherein, the clock delay unit 1 is used for conducting equal-interval delay on clock signals inputted into the input end of the clock delay unit to obtain and output at least three delay clock signals at equal intervals; the weight coefficient unit 2 is used for generating weight signals with the number the same as the number of the delay clock signals according to digital codes inputted into the input end of the weight coefficient unit and outputting the weight signals; the edge addition unit 3 is used for receiving the delay clock signals and the weight signals, conducting weighted summation on the delay clock signals according to the weight signals and outputting signals obtained through weighted summation to obtain new clock signals with continuous clock rising edges/ continuous clock falling edges, wherein the number of the new clock signals is the same as the number of the delay clock signals.

In the above technical solution, by correspondingly adjusting amplitudes of the at least three delay clock signals according to the at least three weight signals generated by the weight coefficient unit 2, it ensures that amplitudes of the new clock signals outputted by the edge addition unit 3 are the same as the amplitudes of the clock signals inputted in the clock delay unit 1, as such, by changing the digital codes inputted in the weight coefficient unit 2, it enables to obtain different weight signals, i.e., to raise or fall the amplitude of one of the at least three continuous clock rising edges or three continuous clock falling edges, to change the occurring time of shifting levels, thereby achieving the delay adjustment or adjustment in advance of clock.

Figure 3:
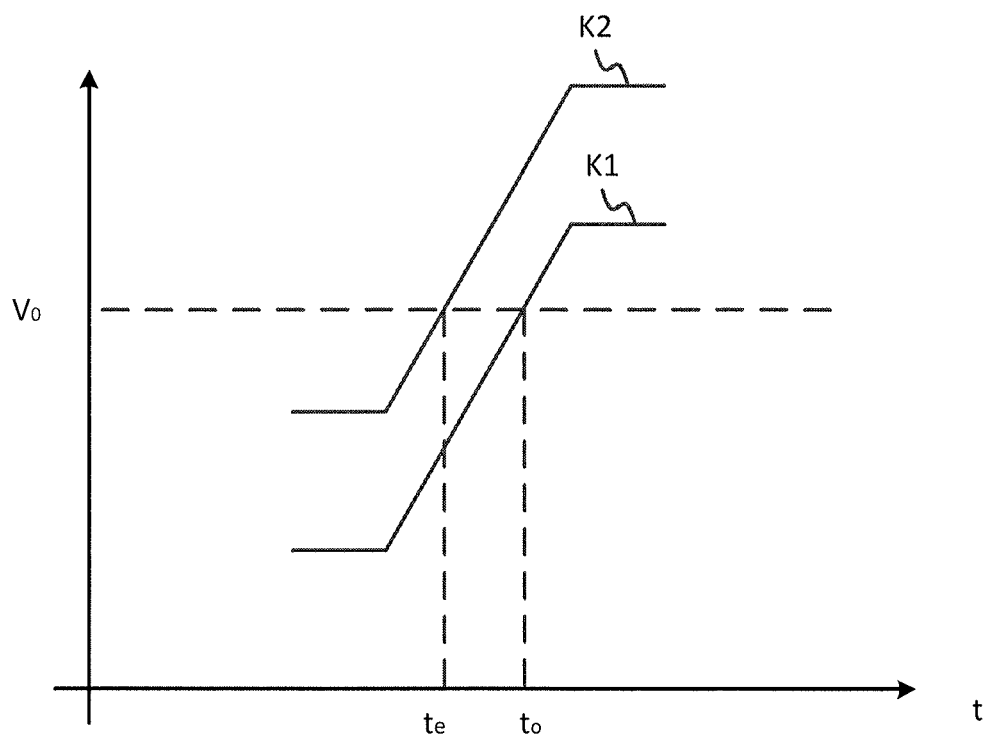
FIG. 3 shows a principle explanation view of the clock delay adjusting circuit based on edge addition.

Further, the principle that the clock delay adjusting circuit based on edge addition achieves the increase or decrease of the clock transmission path delay is illustrated in details herein. As shown in FIG. 3, the horizontal axis represents time, and the vertical axis represents voltage, wherein $V_0$ represents a shifting level. For convenience, herein the adjustment of the rising edges of the clock signals is taken as an example for explanation (the present invention has a same adjustment effect for the falling edges of the invention, which is easily understood by those skilled in the art, and thus the rising edges of the clock signals are taken as examples hereinafter). It can be seen from FIG. 3 that, when the clock signal K1 is overall vertically going up to obtain the clock signal K1', the occurring time of the shifting level $V_0$ changes from $T_o$ to $T_e$, which equivalents to that the clock signal K1' is advanced by a period of $T_o-T_e$ with respect to the clock signal K1, or the overall clock path delay is decreased by a period of $T_o-T_e$. Based on such kind of clock delay adjustment, an adjustment step may be far below the rising edges/falling edges of the clock signals, and achieve a precision of $10^{-15}$ second. The clock delay adjusting circuit based on edge addition only changes the rising edges/falling edges of the clock signals, which helps to change the overall raise or fall of some parts of the rising edges or falling edges of the clock signal while overall amplitude of the clock signal keeps invariant, so as to achieve the delay adjustment of the clock. Therefore, as compared to the existing method based on the delay unit selection, the precision of the clock delay adjustment of the present invention has great improvement.

In order for those skilled in the art to easily understand the present invention, the technical solution of the clock delay adjusting circuit based on edge addition will be illustrated in details hereinafter. It will explain implementations of the case that the clock delay unit 1 generates three delay clock signals and the weight coefficient unit 2 generates three weight signals, correspondingly, the edge addition unit 3 will generates three stages of continuous clock rising edges; those skilled in the art may obtain an implementation scheme that obtains more than three delay clock signals according to the implementations without any creative labor. Moreover, to facilitate the description, let the three delay clock signals be: a first delay clock signal, a second delay clock signal and a third delay clock signal; let the three weight signals be: a first weight signal, a second weight signal and a third weight signal; let the three stages of continuous clock rising edges comprise: a first stage, a second stage and a third stage.

Figure 4:
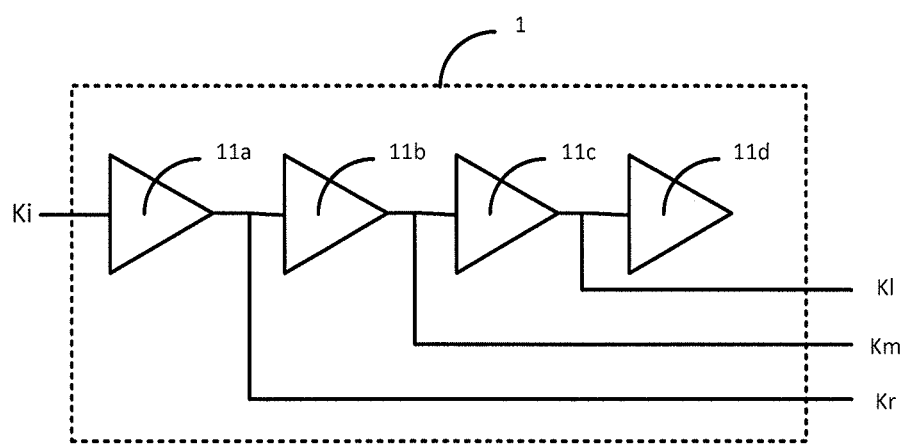
FIG. 4 shows a schematic diagram of a clock delay unit in an embodiment of the clock delay adjusting circuit based on edge addition of the present invention.

To be specific, please refer to FIG. 4, it is shown to a schematic diagram of the clock delay unit 1 in an embodiment of the clock delay adjusting circuit based on edge addition of the present invention, wherein, the clock delay unit 1 comprises four delay circuits with the same structure, i.e., a first delay circuit 11a, a second delay circuit 11b, a third delay circuit 11c and a fourth delay circuit 11d respectively, wherein the first delay circuit 11a, the second delay circuit 11b, the third delay circuit 11c and the fourth delay circuit 11d are sequentially connected in series in the manner that the output end is connected with the input end, i.e., the clock signals are inputted by the input end of the first delay circuit 11a, the output end of the first delay circuit 11a outputs the first delay clock signal and is connected with the input end of the second delay circuit 11b, the output end of the second delay circuit 11b outputs the second delay clock signal and is connected with the input end of the third delay circuit 11c, the output end of the third delay circuit 11c outputs the third delay clock signal and is connected with the input end of the fourth delay circuit 11d, while the output end of the fourth delay circuit 11d is idle without any processing. Herein, the fourth delay circuit 11d corresponds to a load of the third delay circuit 11c, so that the loads of the first delay circuit 11a, the second delay circuit 11b and the third delay circuit 11c are the same, which further ensures that the first delay clock signal, the second delay clock signal and the third delay clock signal are equal-interval delayed in sequence.

More specifically, the four delay circuits in FIG. 4 are implemented by using a difference circuit, then the clock signals inputted in the clock delay unit 1 should be a pair of differential signals, correspondingly, the first delay clock signal, the second delay clock signal and the third delay clock signal are a pair of differential signals, respectively. The obtain of the delay clock signal are a commonly used technology in the prior art, the difference circuits are of a well-known circuit structure in the art, as a result, those skilled in the art may achieve the obtain of the three delay clock signals by thoroughly using the general knowledge and the above technical specification in accordance with the above exemplary illustration, and thus a detailed explanation thereof is omitted.

Figure 5:
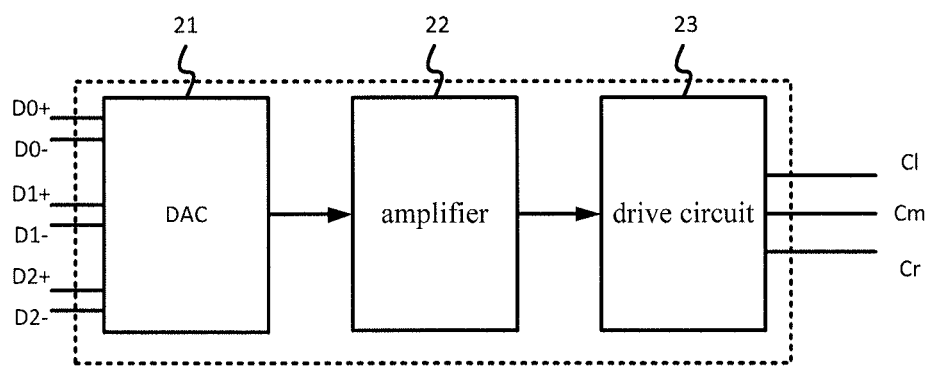
FIG. 5 shows a schematic diagram of a weight coefficient unit in an embodiment of the clock delay adjusting circuit based on edge addition of the present invention.

Further, as shown in FIG. 5, it is shown to a schematic diagram of the weight coefficient unit 2 in an embodiment of the clock delay adjusting circuit based on edge addition of the present invention, wherein the weight coefficient unit 2 comprises a digital-to-analog converter 21 (DAC), an amplifier 22, a drive circuit 23, wherein the digital-to-analog converter 21 is used for converting the digital codes inputted in the input end of the weight coefficient unit 2 into a pair of differential analog signals and outputs the pair of differential analog signals; the amplifier 22 is used for receiving the differential analog signals and outputting amplified differential analog signals; the drive circuit 23 is used for receiving the amplified differential analog signals by the amplifier 22, dividing the amplified differential analog signals into three weight signals and outputting the weight signals.

To be specific, in the above weight coefficient unit 2, the digital-to-analog converter 21 may be a commonly used digital-to-analog circuit, or may be a digital-to-analog converter 21 chip of various standards. Similarly, the amplifier 22 is the same, as long as it satisfies for linearly amplifying the differential analog signals, for example, the amplifier 22 may use a general differential amplifier 22 circuit, etc. Besides, the drive circuit 23 may be implemented by using two emitter followers and two resistors, i.e., the first resistor (R1 as shown in the figure, hereinafter the same) and the second resistor (R2 as shown in the figure, hereinafter the same), with a same resistance value; please refer to FIG. 6, the two emitter follower comprises a first emitter follower 231 and a second emitter follower 233, emitters of the first emitter follower 231 and the second emitter follower 233 are connected in series by the first resistor and the second resistor, the resistance values of the first resistor and the second resistor are the same. Bases of the first emitter follower 231 and the second emitter follower 233 are used for receiving the differential analog signals amplified by the amplifier 22, the three weight signals are outputted by the emitters of the first emitter follower 231 and the second emitter follower 233, and between the first resistor and the second resistor, i.e., the second weight signal is outputted between the first resistor and the second resistor, the first weight signal and the third weight signal are outputted by the first emitter follower 231 and the second emitter follower 233 respectively, so as to ensure that the second weight signal is unchanged and is an average value of the first weight signal and the third weight signal.

Figure 6:
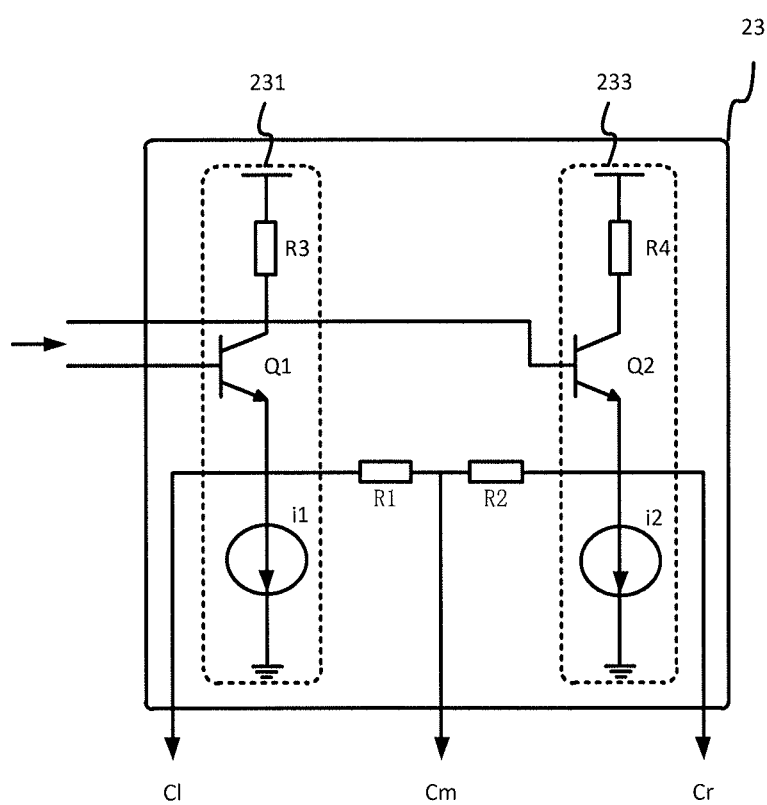
FIG. 6 is a schematic diagram of a drive circuit of the weight coefficient unit in FIG. 5.

More specifically, the first emitter follower 231 and the second emitter follower 233 may use the structure as shown in FIG. 6, i.e., the first emitter follower 231 consists of a third resistor (resistor R3 as shown in figure, hereinafter the same), a first bipolar junction transistor (bipolar junction transistor Q1 as shown in figure, hereinafter the same), a first DC current source (direct current current source i1 as shown in figure, hereinafter the same) and a source voltage, wherein the base of the first bipolar junction transistor is the input end of the drive circuit 23, the emitter of the first bipolar junction transistor is connected with an end of the first DC current source, the collector of the first bipolar junction transistor is connected with an end of the third resistor, the other end of the first DC current source is connected with the negative electrode of the source voltage, the other end of the third resistor is connected with the positive electrode of the source voltage. Similarly, the second emitter follower 233 consists of a fourth resistor (resistor R4 as shown in figure, hereinafter the same), a second bipolar junction transistor (bipolar junction transistor Q2 as shown in figure, hereinafter the same), a second DC current source (direct current voltage source i2 as shown in figure, hereinafter the same) and a source voltage, wherein, the base of the second bipolar junction transistor is the input end of the drive circuit 23, the emitter of the second bipolar junction transistor is connected with an end of the second DC current source, the collector of the second bipolar junction transistor is connected with an end of the fourth resistor, the other end of the DC current source is connected with the negative electrode of the source voltage, the other end of the fourth resistor is connected with the positive electrode of the source voltage.

It should be understood that, the digital-to-analog converter 21 (DAC), the amplifier 22 and the drive circuit 23 in the weight coefficient unit 2 are commonly used circuits in the art; in view of the disclosure of the foregoing technical solutions, those skilled in the art may implement the foregoing technical solution without any creative labor, and thus a detailed explanation thereof is omitted.

Figure 7:
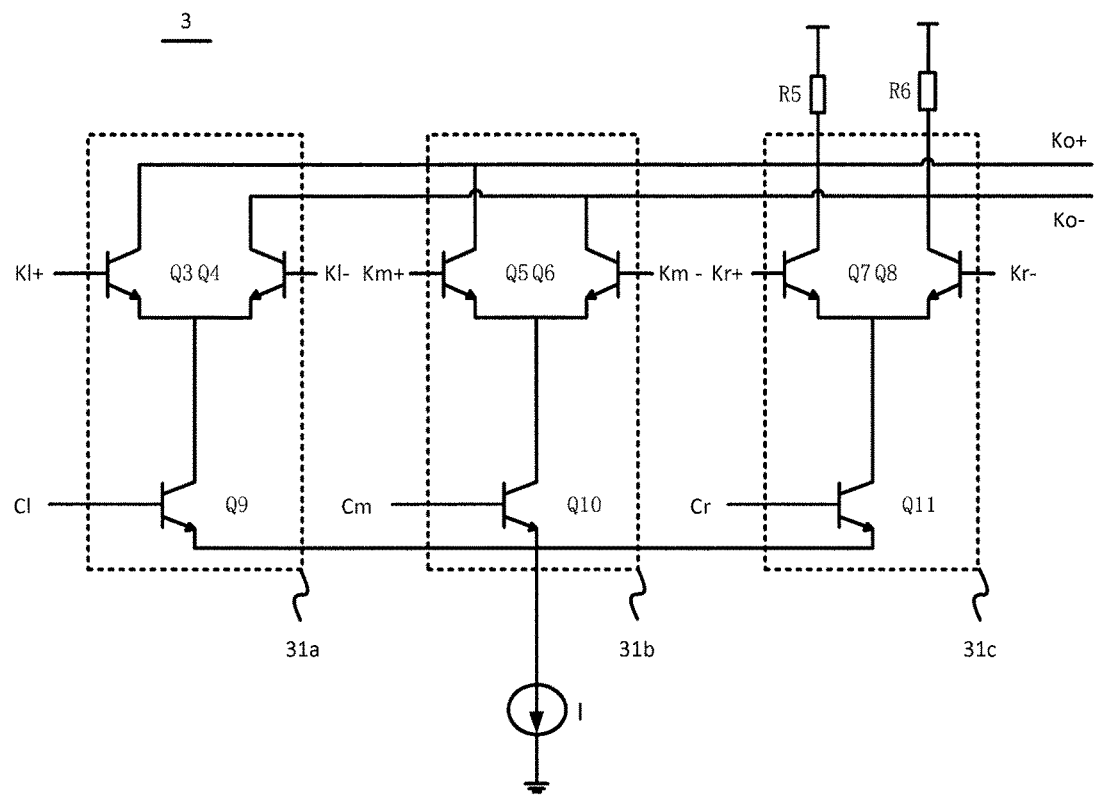
FIG. 7 is a schematic diagram of an edge addition unit in an embodiment of the clock delay adjusting circuit based on edge addition of the present invention.

Further, referring to FIG. 7 in conjunction of FIGS. 4 and 5, it is shown to a schematic diagram of the edge addition unit 3 in an embodiment of the clock delay adjusting circuit based on edge addition of the present invention; it can be seen from the figures that, the edge addition unit 3 comprises a pair of summation fifth resistor (resistor R5 as shown in figure, hereinafter the same) and sixth resistor (resistor R6 as shown in figure, hereinafter the same), a third DC current source (direct current current source I as shown in figure, hereinafter the same) and a source voltage, as well as the three differential pair circuits with the same number as the number of the delay clock signals; wherein, to be specific, the three differential pair circuits are the first differential pair circuit 31a, the second differential pair circuit 31b and the third differential pair circuit 31c; the first differential pair circuit 31a consists of a third bipolar junction transistor (bipolar junction transistor Q3 as shown in figure, hereinafter the same), a fourth bipolar junction transistor (bipolar junction transistor Q4 as shown in figure, hereinafter the same) and a ninth bipolar junction transistor (bipolar junction transistor Q9 as shown in figure, hereinafter the same); bases of the third bipolar junction transistor and the fourth bipolar junction transistor serve as the first input end of the first differential pair circuit 31a, collectors of the third bipolar junction transistor and the fourth bipolar junction transistor serve as the output end of the first differential pair circuit 31a, emitters of the third bipolar junction transistor and the fourth bipolar junction transistor are connected with the collector of the ninth bipolar junction transistor, the base of the ninth bipolar junction transistor serves as a second input end of the first differential pair circuit 31a; Likewise, the second differential pair circuit 31b consists of the fifth bipolar junction transistor (bipolar junction transistor Q5 as shown in figure, hereinafter the same), the sixth bipolar junction transistor (bipolar junction transistor Q6 as shown in figure, hereinafter the same) and the tenth bipolar junction transistor (bipolar junction transistor Q10 as shown in figure, hereinafter the same); bases of the fifth bipolar junction transistor and the sixth bipolar junction transistor serve as the first input end of the second differential pair circuit 31b, collectors of the fifth bipolar junction transistor and the sixth bipolar junction transistor serve as the output end of the second differential pair circuit 31b, emitters of the fifth bipolar junction transistor and the sixth bipolar junction transistor are together connected with the collector of the tenth bipolar junction transistor, the base of the tenth bipolar junction transistor serves as the second input end of the second differential pair circuit 31b; the third differential pair circuit 31c consists of the seventh bipolar junction transistor (bipolar junction transistor Q7 as shown in figure, hereinafter the same), the eighth bipolar junction transistor (bipolar junction transistor Q8 as shown in figure, hereinafter the same) and the eleventh bipolar junction transistor (bipolar junction transistor Q11 as shown in figure, hereinafter the same); bases of the seventh bipolar junction transistor and the eighth bipolar junction transistor serve as the first input end of the third differential pair circuit 31c, collectors of the seventh bipolar junction transistor and the eighth bipolar junction transistor serve as the output end of the third differential pair circuit 31c, emitters of the seventh bipolar junction transistor and the eighth bipolar junction transistor are together connected with the collector of the eleventh bipolar junction transistor the base of the eleventh bipolar junction transistor serves as the second input end of the third differential pair circuit 31c; emitters of the ninth bipolar junction transistor the tenth bipolar junction transistor and the eleventh bipolar junction transistor are together connected with an end of the third DC current source, the other end of the third DC current source is connected with the negative electrode of the source voltage; an end of the fifth resistor is connected with the collectors of the third bipolar junction transistor, the fifth bipolar junction transistor and the seventh bipolar junction transistor, the other end of the fifth resistor is connected with the positive electrode of the source voltage; and end of the sixth resistor is connected with the collectors of the fourth bipolar junction transistor, the sixth bipolar junction transistor and the eighth bipolar junction transistor, the other end of the sixth resistor is connected with the positive electrode of the source voltage.

To be specific, when in use, the first input ends of the first differential pair circuit 31a, the second differential pair circuit 31b and the third differential pair circuit 31c are used for correspondingly receiving the first delay clock signal, the second delay clock signal and the third delay clock signal, respectively; the second input ends of the first differential pair circuit 31a, the second differential pair circuit 31b and the third differential pair circuit 31c are used for corresponding to the first weight signal, the second weight signal and the third weight signal; and finally the output ends of the first differential pair circuit 31a, the second differential pair circuit 31b and the third differential pair circuit 31c are together connected to output the new clock signals.

More specifically, in the above edge addition unit 3, by adjusting the base voltages of the ninth bipolar junction transistor, the tenth bipolar junction transistor and the first bipolar junction transistor allocation proportions of the third DC current source in the three differential pair circuits may be implemented; the specific working principle of the edge addition unit 3 is processed in two steps: in the first step, the first delay clock signal, the second delay clock signal and the third delay clock signal are amplified (or reduced) by the first differential pair circuit 31a, the second differential pair circuit 31b and the third differential pair circuit 31c, respectively; while the amplification (or reduction) factors (i.e., weighting factor) are adjusted by the first weight signal, the second weight signal and the third weight signal, respectively; in the second step, the outputs of the first differential pair circuit 31a, the second differential pair circuit 31b and the third differential pair circuit 31c are weighted summation by the summation of the fifth resistor and the sixth resistor. Since the first input ends of the first differential pair circuit 31a, the second differential pair circuit 31b and the third differential pair circuit 31c input the first delay clock signal, the second delay clock signal and the third delay clock signal at equal intervals, respectively, the summing and adjusting of the rising edges of the clock signals are achieved from the following analysis.

Figure 8A:
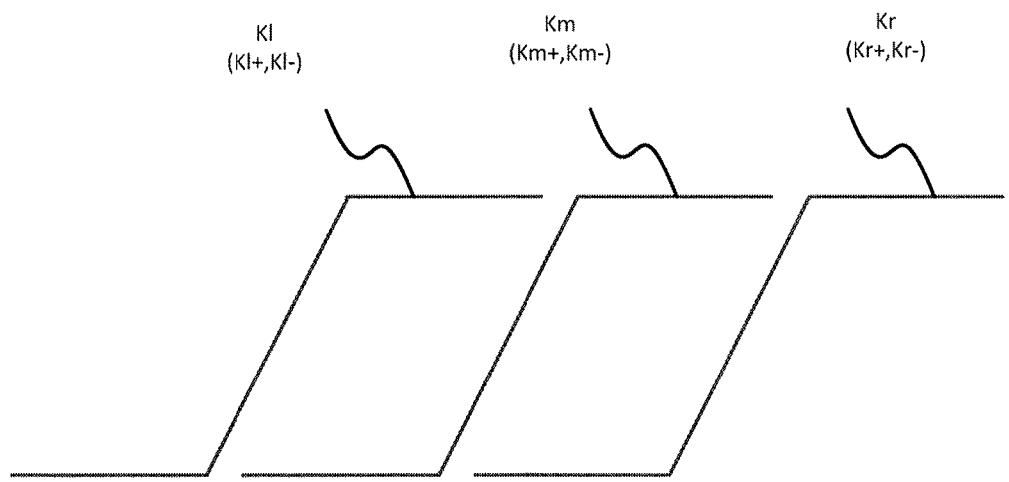
FIG. 8a shows three delay clock signals outputted by the clock delay unit.

Further, please refer to FIGS. 8a-8b in conjunction with FIGS. 4-7, the principle of the edge addition unit 3 on how to achieve the summing and adjusting of the rising edges of the clock signals will be illustrated in details hereinafter. To be specific, the working principle of the edge addition unit 3 will be illustrated in details in two cases, i.e., a case without a delay adjustment and a case with a delay adjustment.

Figure 8B:
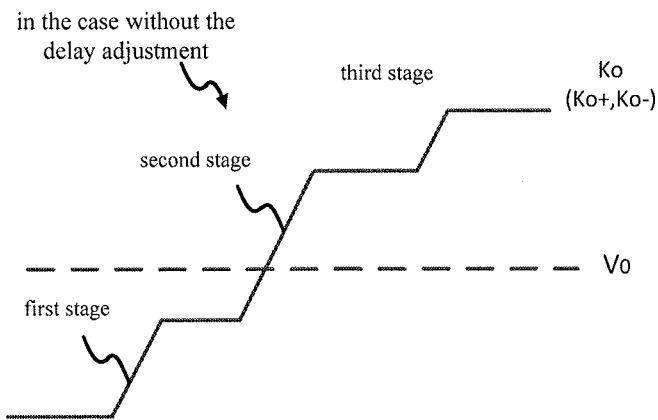
FIG. 8b shows new clock signals outputted by the edge addition unit without any delay adjustment.

Firstly, in the case without the delay adjustment:

in the case without the delay adjustment, the weight signals outputted by the weight coefficient unit 2 is: $c_l-c_r=0$, $c_l=c_r=c_m$. At this point, the third direct current voltage source in FIG. 7 evenly passes through the three differential pair circuits. As shown in FIG. 8a, when the rising edge of the delay clock signal $k_{l+}-k_{l-}$ (i.e., the first delay clock signal outputted by the clock delay unit 1) arrives, the clock signal $k_{o+}-k_{o-}$ outputted by the output end of the clock delay unit 3 raises from 0 to $$\frac{IR}{3}$$

the first stage of the new clock signal in FIG. 8b); when the rising edge of the delay clock signal $k_{m+}-k_{m-}$ (i.e., the second delay clock signal outputted by the clock delay unit 1) arrives, the clock signal $k_{o+}$-$k_{o-}$ outputted by the output end of the clock delay unit 3 raises from $$\frac{IR}{3} \text{ to } \frac{2IR}{3}$$

(the second stage of the new clock signal in FIG. 8b); when the rising edge of the delay clock signal $k_{r+}$-$k_{r-}$ (i.e., the third delay clock signal outputted by the clock delay unit 1) arrives, the clock signal $k_{o+}$-$k_{o-}$ outputted by the output end of the clock delay unit 3 raises from $$\frac{2IR}{3}$$

to IR (the third stage of the new clock signal in FIG. 8b). That is, the clock rising edges of the new clock signal consists of the first stage, the second stage and the third stage.

Secondly, in the case with the delay adjustment:

In the case with the delay adjustment, assuming that the weight signal outputted by the weight coefficient unit 2 is $\Delta v$, i.e., $$c_l = c_m + \frac{\Delta v}{2}, c_r = c_m - \frac{\Delta v}{2}.$$

In FIG. 7, tail current of the third DC current source flowing to the left differential pair circuit (i.e., the first differential pair circuit 31a) will be increased by $$\frac{\Delta v}{2} g_m,$$

while tail current flowing to the right differential pair circuit (i.e., the second differential pair circuit 31b) will be decreased by $$\frac{\Delta v}{2} g_m.$$

Herein, $g_m$ is a transconductance of the ninth bipolar junction transistor, the tenth bipolar junction transistor or the eleventh bipolar junction transistor (the transconductance thereof is the same due to the same size they have). In such case, when the rising edge of the delay clock signal $k_{l+}$-$k_{l-}$ (i.e., the first delay clock signal outputted by the clock delay unit 1) arrives, the clock signal $k_{o+}$-$k_{o-}$ outputted by the output end of the clock delay unit 3 raises from 0 to $$R\left(\frac{I}{3} + \frac{\Delta v}{2} g_m\right)$$

(e.g., the first stage of the new clock signal in FIG. 8c), and the raising time thereof is same as that of the first stage of the new clock signal in FIG. 8b; when the rising edge of the delay clock signal $k_{m+}$-$k_{m-}$ (i.e., the second delay clock signal outputted by the clock delay unit 1) arrives, the outputted clock signal $k_{o+}$-$k_{o-}$ raises from $$R\left(\frac{I}{3} + \frac{\Delta v}{2} g_m\right) \text{ to } R\left(\frac{I}{3} + \frac{\Delta v}{2} g_m\right) + \frac{IR}{3}$$

(e.g., the second stage of the new clock signal in FIG. 8c), which is totally similar to the second stage of the new clock signal in FIG. 8b with an overall vertical raising height of $$\frac{\Delta v}{2} g_m R,$$

as such, the occurring time of the shifting level is advanced by $$T = \frac{\Delta v}{2} g_m R/a \text{ seconds,}$$

or in other words. the clock delay is decreased by $$= \frac{\Delta v}{2} g_m R/a \text{ second,}$$

wherein the a herein refers to a slope of the second stage of the new clock signal; when the rising edge of the delay clock signal $k_{r+}$-$k_{r-}$ (i.e., the third delay clock signal outputted by the clock delay unit 1) arrives, the clock signal $k_{o+}$-$k_{o-}$ outputted by the output end of the edge addition unit 3 raises from $$R\left(\frac{I}{3} + \frac{\Delta v}{2} g_m\right) + \frac{IR}{3} \text{ to } R\left(\frac{I}{3} + \frac{\Delta v}{2} g_m\right) + \frac{IR}{3} + R\left(\frac{I}{3} - \frac{\Delta v}{2} g_m\right) = RI$$

(e.g., the third stage of the new clock signal in FIG. 8c), likewise, in the case with the delay adjustment, the first stage, the second stage and the third stage outputted by the edge addition unit 3 constitutes the clock rising edge of the new clock signal; it can be seen from the foregoing overall adjustment process that, the overall height of the new clock signal outputted both in the cases with or without delay adjustment remain the same, i.e., the amplitudes of the new clock signals remain the same.

Further, in the case with the delay adjustment, $$a = \frac{IR}{3\tau}, \tag{2}$$

Figure 8C:
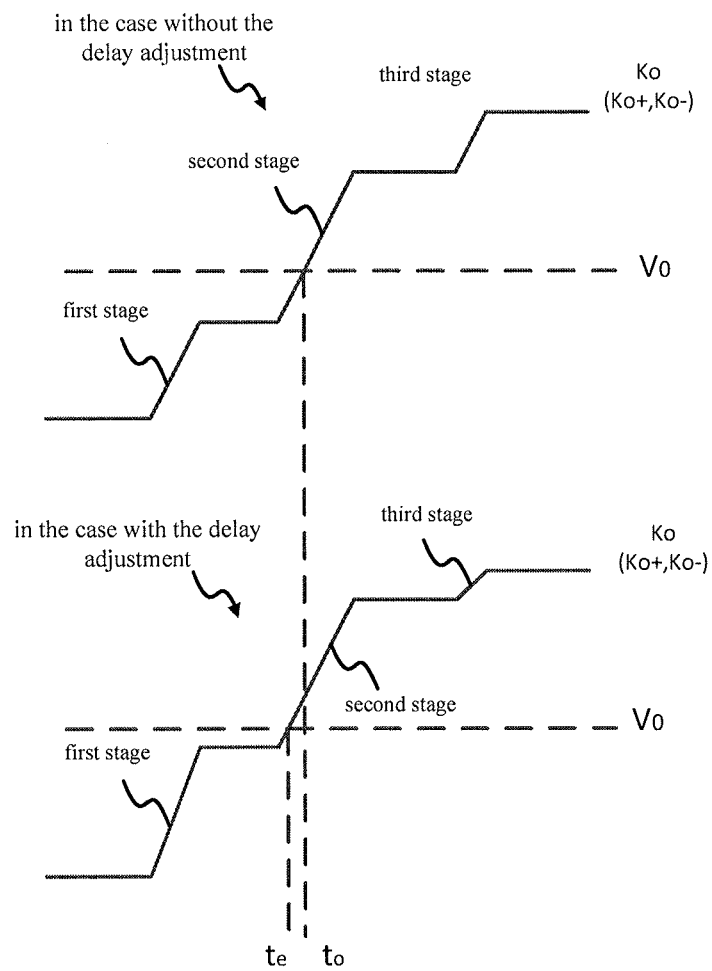
FIG. 8c shows a comparison diagram of new clock signals outputted by the edge addition unit with and without the delay adjustment.

In the above formula, $\tau$ refers to a raising time of the second stage of the new clock signal in FIG. 8c, then by substituting the formula (2) into the above $$T = \frac{\Delta v}{2} g_m R/a,$$

the following is obtained:

$$T = \frac{3\Delta v \tau}{2I} g_m. \tag{3}$$

Besides, $$g_m = I/3V_t, \quad (4)$$

In the above formula, $V_t$ is a physical constant that is directly proportional to an absolute temperature, then by substituting the formula (4) into the formula (3), it is obtained that:

$$T = \frac{\Delta v \tau}{2V_t}, \quad (5)$$

Because that $\Delta v$ is a weighing signal outputted by the weight coefficient unit 2, thus, $$\Delta v = N*LSB \quad (6)$$

In the above formula, N is a digital code inputted in the weight coefficient unit 2, $L_{SB}$ is a step of the DAC circuit, then by substituting the formula (6) into the formula (5), it is obtained that:

$$T = \frac{N L_{SB} \tau}{2V_t}. \quad (7)$$

It can be seen from the above formulas that, the clock delay time can be controlled by digital codes, while it also can be seen from the above analysis that in such adjusting manner, the adjusting step is far below the raising edges/falling edges of the clock and may achieve an order of $10^{-15}$ second (fs).

Besides, in the practical application process, the clock delay adjusting circuit based on edge addition of the present invention can be made into a circuit chip, by which an integrated chip having clock delay adjustment is provided.

To sum up, by overall raising or falling the raising edges of the clock, the present invention enables to achieve the advance or delay of the occurring time of shifting level, so as to achieve the increase or decrease of the clock transmission path delay, with adjustment accuracy of the order of $10^{-15}$ (fs). Therefore, the present well solves the problems that the conventional clock delay adjusting method and circuit is low in adjustment accuracy and can not satisfy the requirement of a high speed, high-precision time-share sampling ADC for accurate clock delay adjustments.

The invention claimed is:

1. A clock delay adjusting circuit based on edge addition, comprising:
   a clock delay unit, which is used for conducting equal-interval delay on clock signals inputted into the input end of the clock delay unit to obtain and output at least three delay clock signals at equal intervals;
   a weight coefficient unit, which is used for generating weight signals with the number the same as the number of the delay clock signals according to digital codes inputted into the input end of the weight coefficient unit and outputting the weight signals;
   an edge addition unit, which is used for receiving the delay clock signals and the weight signals, conducting weighted summation on the delay clock signals according to the weight signals and outputting signals obtained through weighted summation to obtain a new clock signal with continuous clock rising edges/continuous clock falling edges, wherein the number of continuous clock rising edges/continuous clock falling edges of the new clock signal is the same as that of the delay clock signals;
   wherein one of the weight signals is an average value of all other weight signals.

2. The clock delay adjusting circuit based on edge addition as in claim 1, wherein, the three delay clock signals comprise a first delay clock signal, a second delay clock signal and a third delay clock signal.

3. The clock delay adjusting circuit based on edge addition as in claim 2, wherein, the clock delay unit comprises four delay circuits with the same structure, which are a first delay circuit, a second delay circuit, a third delay circuit and a fourth delay circuit respectively; wherein an input end of the first delay circuit is used for receiving the clock signals, an output end of the first delay circuit outputs the first delay clock signal and is connected with an input end of the second delay circuit, an output end of the second delay circuit outputs the second delay clock signal and is connected with an input end of the third delay circuit, an output end of the third delay circuit outputs the third delay clock signal and is connected with an input end of the fourth delay circuit, an output end of the fourth delay circuit is idle.

4. The clock delay adjusting circuit based on edge addition as in claim 3, wherein, the first delay circuit, the second delay circuit, the third delay circuit and the fourth delay circuit are difference circuits respectively, the clock signals inputted into the first delay circuit are a pair of differential signals.

5. An integrated chip of a clock delay adjusting circuit based on edge addition, wherein, the integrated chip comprises the clock delay adjusting circuit based on edge addition as in claim 4.

6. An integrated chip of a clock delay adjusting circuit based on edge addition, wherein, the integrated chip comprises the clock delay adjusting circuit based on edge addition as in claim 3.

7. The clock delay adjusting circuit based on edge addition as in claim 2, wherein, the weight coefficient unit comprises:
   a digital-to-analog converter, which is used for converting the digital codes received from the input end of the weight coefficient unit into a pair of differential analog signals and outputting the pair of differential analog signals;
   an amplifier, which is used for receiving the differential analog signals and outputting amplified differential analog signals;
   a drive circuit, which is used for receiving the amplified differential analog signals by the amplifier, dividing the amplified differential analog signals into weight signals with the number the same as the number of the delay clock signals, and outputting the weight signals.

8. An integrated chip of a clock delay adjusting circuit based on edge addition, wherein, the integrated chip comprises the clock delay adjusting circuit based on edge addition as in claim 7.

9. An integrated chip of a clock delay adjusting circuit based on edge addition, wherein, the integrated chip comprises the clock delay adjusting circuit based on edge addition as in claim 2.

10. The clock delay adjusting circuit based on edge addition as in claim 1, wherein, the weight coefficient unit comprises:
    a digital-to-analog converter, which is used for converting the digital codes received from the input end of the weight coefficient unit into a pair of differential analog signals and outputting the pair of differential analog signals;

an amplifier, which is used for receiving the differential analog signals and outputting amplified differential analog signals;

a drive circuit, which is used for receiving the amplified differential analog signals by the amplifier, dividing the amplified differential analog signals into weight signals with the number the same as the number of the delay clock signals, and outputting the weight signals.

11. The clock delay adjusting circuit based on edge addition as in claim 10, wherein, the drive circuit comprises a first emitter follower, a second emitter follower, a first resistor and a second resistor, wherein, the first resistor and the second resistor have a same resistance value; and, the first emitter follower consists of a third resistor, a first bipolar junction transistor, a first DC current source and a source voltage, wherein a base of the first bipolar junction transistor is an input end of the drive circuit, an emitter of the first bipolar junction transistor is connected with an end of the first DC current source, the other end of the first DC current source is connected with a negative electrode of the source voltage, a collector of the first bipolar junction transistor is connected with an end of the third resistor, the other end of the third resistor is connected with a positive electrode of the source voltage;

the second emitter follower consists of a fourth resistor, a second bipolar junction transistor, a second DC current source and a source voltage, wherein a base of the second bipolar junction transistor is an input end of the drive circuit, an emitter of the second bipolar junction transistor is connected with an end of the second DC current source, the other end of the second DC current source is connected with the negative electrode of the source voltage, a collector of the second bipolar junction transistor is connected with an end of the fourth resistor, the other end of the fourth resistor is connected with a positive electrode of the source voltage;

an end of the first resistor is connected with the emitter of the first bipolar junction transistor, the other end of the first resistor is connected with an end of the second resistor, the other end of the second resistor is connected with the emitter of the second bipolar junction transistor, the bases of the first bipolar junction transistor and the second bipolar junction transistor are used for receiving the differential analog signals amplified by the amplifier, the weight signals are outputted by the emitters of the first bipolar junction transistor and the second bipolar junction transistor, as well as between the first resistor and the second resistor.

12. The clock delay adjusting circuit based on edge addition as in claim 11, wherein, the weight signals are a first weight signal, a third weight signal and a second weight signal in sequence, the second weight signal is an average value of the first weight signal and the third weight signal.

13. An integrated chip of a clock delay adjusting circuit based on edge addition, wherein, the integrated chip comprises the clock delay adjusting circuit based on edge addition as in claim 12.

14. An integrated chip of a clock delay adjusting circuit based on edge addition, wherein, the integrated chip comprises the clock delay adjusting circuit based on edge addition as in claim 11.

15. The clock delay adjusting circuit based on edge addition as in claim 10, wherein, the edge addition unit consists of a fifth resistor, a sixth resistor, a third DC current source, a source voltage and differential pair circuits, wherein the number of the differential pair circuits is the same as the number of the delay clock signals, the differential pair circuits are a first differential pair circuit, a second differential pair circuit and a third differential pair circuit respectively;

the first differential pair circuit consists of a third bipolar junction transistor, a fourth bipolar junction transistor and a ninth bipolar junction transistor, bases of the third bipolar junction transistor and the fourth bipolar junction transistor serve as a first input end of the first differential pair circuit, collectors of the third bipolar junction transistor and the fourth bipolar junction transistor serve as an output end of the first differential pair circuit, emitters of the third bipolar junction transistor and the fourth bipolar junction transistor are together connected with a collector of the ninth bipolar junction transistor, a base of the ninth bipolar junction transistor serves as a second input end of the first differential pair circuit;

the second differential pair circuit consists of a fifth bipolar junction transistor, a sixth bipolar junction transistor and a tenth bipolar junction transistor, bases of the fifth bipolar junction transistor and the sixth bipolar junction transistor serve as a first input end of the second differential pair circuit, collectors of the fifth bipolar junction transistor and the sixth bipolar junction transistor serve as an output end of the second differential pair circuit, emitters of the fifth bipolar junction transistor and the sixth bipolar junction transistor are together connected with a collector of the tenth bipolar junction transistor, a base of the tenth bipolar junction transistor serves as a second input end of the second differential pair circuit;

the third differential pair circuit consists of a seventh bipolar junction transistor, an eighth bipolar junction transistor and an eleventh bipolar junction transistor, bases of the seventh bipolar junction transistor and the eighth bipolar junction transistor serve as a first input end of the third differential pair circuit, collectors of the seventh bipolar junction transistor and the eighth bipolar junction transistor serve as an output end of the third differential pair circuit, emitters of the seventh bipolar junction transistor and the eighth bipolar junction transistor are together connected with a collector of the eleventh bipolar junction transistor, a base of the eleventh bipolar junction transistor serves as a second input end of the third differential pair circuit;

emitters of the ninth bipolar junction transistor, the tenth bipolar junction transistor and the eleventh bipolar junction transistor are together connected with an end of the third DC current source, the other end of the third DC current source is connected with the negative electrode of the source voltage; an end of the fifth resistor is connected with the collectors of the third bipolar junction transistor, the fifth bipolar junction transistor and the seventh bipolar junction transistor, the other end of the fifth resistor is connected with a positive electrode of the source voltage; and an end of the sixth resistor is connected with the collectors of the fourth bipolar junction transistor, the sixth bipolar junction transistor and the eighth bipolar junction transistor, the other end of the sixth resistor is connected with a positive electrode of the source voltage.

16. An integrated chip of a clock delay adjusting circuit based on edge addition, wherein, the integrated chip comprises the clock delay adjusting circuit based on edge addition as in claim 15.

17. An integrated chip of a clock delay adjusting circuit based on edge addition, wherein, the integrated chip comprises the clock delay adjusting circuit based on edge addition as in claim 10.

18. An integrated chip of a clock delay adjusting circuit based on edge addition, wherein, the integrated chip comprises the clock delay adjusting circuit based on edge addition as in claim 1.

* * * * *